United States Patent [19]

Schlesinger et al.

[11] 4,054,451

[45] Oct. 18, 1977

[54] METHOD OF POLYMERIZING A COPOLYMER OF GLYCIDYL METHACRYLATE AND ALLYL GLYCIDYL ETHER

[75] Inventors: Sheldon I. Schlesinger, East Windsor Township, Mercer County, N.J.; Veronica Cochran, Armonk, N.Y.

[73] Assignee: American Can Company, Greenwich, Conn.

[21] Appl. No.: 697,001

[22] Filed: June 17, 1976

Related U.S. Application Data

[60] Continuation-in-part of Ser. No. 509,685, Sept. 26, 1974, abandoned, which is a division of Ser. No. 297,829, Oct. 16, 1972, abandoned.

[51] Int. Cl.$^2$ .......................... G03C 5/00; G03C 1/68; C08F 8/18
[52] U.S. Cl. ..................... 96/35.1; 96/27 H; 96/115 R; 204/159.18; 204/159.23; 427/43; 526/51
[58] Field of Search ............... 96/115 R, 115 P, 87 R, 96/35.1, 91 R, 27 H; 204/159.18, 159.23; 427/43, 44, 53, 54; 526/51

[56] References Cited

U.S. PATENT DOCUMENTS 3,708,296  1/1973  Schlesinger .................. 96/115 R

*Primary Examiner*—Jack P. Brammer
*Attorney, Agent, or Firm*—Robert P. Auber; Ernestine C. Bartlett; Ira S. Dorman

[57] ABSTRACT

Copolymers of glycidyl methacrylate and allyl glycidyl ether having pendant epoxy groups, having an inherent viscosity of at least about 0.25, preferably within the range of about 0.25 to about 0.38, and an epoxy equivalent of at least about 0.65 epoxide equivalent per 100g. of polymer are provided which upon admixture with a radiation-sensitive aryldiazonium salt provide compositions which exhibit improved sensitivity, curing rates and other properties. Articles for recording and storing information from a laser source and other articles such as microfilm are derived from such compositions by subjecting a coated substrate to an energy source of sufficient intensity to decompose the radiation-sensitive catalyst and thus effect polymerization via the epoxy groups of the copolymer.

9 Claims, No Drawings

METHOD OF POLYMERIZING A COPOLYMER OF GLYCIDYL METHACRYLATE AND ALLYL GLYCIDYL ETHER

CROSS-REFERENCE TO RELATED APPLICATIONS

This application is a continuation-in-part of copending application Ser. No. 509,685 filed Sept. 26, 1974 now abandoned which is in turn a divisional of application Ser. No. 297,829 filed Oct. 16, 1972, now abandoned.

BACKGROUND OF THE INVENTION

In U.S. Ser. No. 753,869, filed Aug. 20, 1968 entitled "Photopolymerization of Epoxy Monomers", now U.S. Pat. No. 3,708,296 issued Jan. 2, 1973, there are disclosed novel compositions comprising various epoxy materials and certain latent curing catalysts therefor. Such compositions are photosensitive and when exposed to an energy source such as actinic radiation yield epoxy polymers which are receptive to ink and possess inherent toughness, abrasion resistance, adherence to metal surfaces, resistance to chemical attack, etc. and are thus valuable for many applications particularly those involving formation of acid and alkali resist images for chemical milling, gravure images, offset plates, stencil-making, etc.

It has now been discovered that a specific epoxide material, a copolymer of glycidyl methacrylate and allyl glycidyl ether, specially prepared, when utilized with the latent curing catalysts of said U.S. Pat. No. 3,708,296 is unique in exhibiting superior photosensitivity, adhesion and other properties, may be rapidly cured after a short exposure to an energy source without the additional application of thermal energy such as heat and is readily prepared by a process as described hereinbelow. It has further been discovered that such superior properties of said copolymeric epoxide material renders it eminently suitable for use in the recording and storage of information derived from a laser source, particularly as holograms.

U.S. Pat. No. 3,074,869 discloses epoxy resin prepolymers, including polyglycidyl methacrylate, cured with certain nitrosamines via a free radical mechanism. Compositions containing this homopolymer however, following light exposure, must be heated to 140° C to cure or crosslink the polymer so that an image may be developed. Further, preparation of the homopolymer is tedious requiring 3 to 4 days of heating at 50° C to yield a useful polymerizable product.

The advantages of the copolymers of this invention over such prior art homopolymers in ease of preparation and rapid curing and use without subsequent heat are readily apparent and provision of such copolymers fulfills a need in the art for such products in terms of efficiency and superior properties. Moreover, as further illustrated hereinbelow, such a homopolymer does not lead to products of photosensitivity comparable to that of the copolymer of the invention.

It is known to employ various presensitized substances including silver halide film, bichromated gelatin and photopolymers such as photochromic spiropirans and compounds derived from barium acrylate, lead acrylate-acrylamide with photocatalyst solution comprising methylene blue and sodium salts of various organic acids to record laser interference patterns. Such disclosures appear in the literature at Applied Physics Letters, Vol. 15, No. 7, October, 1969 (p. 201-203; Ibid., Vol. 14, No. 5, March, 1969 (p. 159-160).

None of these existing systems are without serious deficiencies either in terms of low resolution of images, instable image formation, difficulty and slowness in processing, short-life of systems employed or the use of expensive silver salts.

The present invention provides substances for this purpose that are devoid of the deficiencies listed above.

SUMMARY OF THE INVENTION

The present invention provides novel and unique copolymers of glycidyl methacrylate and allyl glycidyl ether having pendant epoxy groups and having an inherent viscosity of at least about 0.25, preferably within the range of about 0.25 to 0.38, and an epoxide equivalent of at least about 0.65 per 100g. of polymer derived from a process which comprises admixing the respective monomers, in the presence of a polymerization catalyst such as benzoyl peroxide, in a solvent which permits reflux of the reactants at a temperature below about 100° C.

The invention further provides novel polymerizable compositions containing, as latent curing catalysts, aryl diazonium salts which are radiation-sensitive and release an active catalyst upon the application of energy such as an actinic radiation or a coherent beam of energy as from a laser source and the use of such compositions for the production of articles suitable for recording and storing information derived from such an energy source.

DETAILED DESCRIPTION OF THE INVENTION

I. Glycidyl methacrylate-allyl glycidyl ether copolymers and preparation thereof.

The copolymers of the present invention are characterized by having an inherent viscosity of at least about 0.25 and preferably within the range of 0.25 to 0.38, and an epoxide equivalent of at least about 0.65, preferably 0.65 to 0.74 epoxide equivalent per 100g. of polymer. As will be illustrated hereinbelow, these parameters are of a critical nature since copolymers that do not exhibit the specified parameters are deficient for the purpose of the present invention.

The values of inherent viscosity herein are measured in butyronitrile at 25° C unless otherwise indicated. The inherent viscosity is an indication of molecular weight and is determined according to the equation $$\eta \text{ inh} = \frac{\ln(\eta_1/\eta_0)}{C}$$

where C = concentration of copolymer in grams per 100 ml. of solvent and ln ($\eta_1/\eta_0$) = the natural logarithm of the relative viscosity of the dilute solution.

As is well known in the art, inherent viscosity is an indication of molecular weight of polymers. Thus, molecular weights for the copolymers of this invention having an inherent viscosity of at least about 0.25 will be at least about 3000 and copolymers having inherent viscosities within the preferred range of 0.25 to 0.38 will have molecular weights within the range of about 3000 to about 6000.

The present invention provides copolymers that must necessarily possess balanced properties exemplified by the epoxide equivalent and inherent viscosity, the combination of which are critical and essential to derive the properties of superior photosensitivity. Since the reacting monomers possess both epoxide groups and ethylenically unsaturated double bonds which are both capable of undergoing polymerization and/or cross-linking, it is possible to produce polymers exhibiting either the inherent viscosity procribed herein and not the epoxide equivalent or the epoxide equivalent and not the inherent viscosity, none of which exhibit the characteristics of polymers possessing the combined proscribed parameters. It is essential to this invention that the copolymer be prepared under conditions wherein polymerization proceeds substantiallly via the double bonds to a molecular weight (defined by inherent viscosity) as proscribed while at the same time providing sufficient epoxy groups (defined by epoxide equivalent per 100 grams of polymer) as proscribed. It has been found that copolymers having the combined proscribed epoxide equivalent and inherent viscosity become insoluble at a faster rate upon exposure to irradiation than copolymers exhibiting only one of the proscribed epoxide equivalent or inherent viscosity. Variation from reaction conditions may result in either a low molecular weight (low inherent viscosity) polymer having an epoxide equivalent within the proscribed limits which cures at an unacceptably slow rate or in a high molecular weight polymer (high inherent viscosity) accompanied by a loss of epoxy groups (low epoxide equivalent) which results in a difficulty soluble or insoluble product which is either not soluble enough to be used at all or is extremely slow and difficult to develop. It is believed that those copolymers outside the parameters of this invention may be the result of premature crosslinking of the growing free radical copolymer via the epoxy groups rather than via the ethylenically unsaturated double bonds as desired. Additionally, uncontrolled increase in chain length of the growing free-radically initiated methacrylate and allylic portions of the monomer and polymers in the reaction mixture may result in unusually high molecular weight polymers that are not useful according to the invention.

The critical epoxide equivalent and inherent viscosity of the copolymers are selectively controlled by the reaction conditions in terms of temperature and relative molar proportions of the reaction monomers and catalysts. In general, copolymers exhibiting the necessary viscosity and epoxide equivalent may be obtained when employing from about a 4 to 5 molar excess of the glycidyl methacrylate, the preferred proportions being within the range of about 4 to 5 moles of glycidyl methacrylate per mole of allyl glycidyl ether and especially about 4.5–5.0 moles of glycidyl methacrylate per mole of allyl glycidyl ether.

The copolymerization is conducted in the presence of a polymerization catalyst which is a free radical generator and which facilitates copolymerization via the double bonds thus rendering a product having pendant epoxy groups suitable for further cationic polymerization via opening of the epoxy groups initiated by the radiation-sensitive initiators. Examples of such catalysts include benzoyl peroxide, azo-bis (isobutyronitrile), p-chlorobenzoyl peroxide, t-butylperoxyoctoate, t-butylperoxy maleic acid, lauroyl peroxide, peroxide, etc. of which benzoyl peroxide is the preferred catalyst. Generally, the catalyst is employed in amounts ranging from 0.40 to 0.60 mol%, based on the molar concentration of the monomers and is preferably from 0.50 to 0.55 mol%.

The reaction may preferably be carried out in various solvents which have boiling points below 100° C. It is necessary that either solvents of higher boiling points be excluded or the temperature controlled at 100° C or below since it has been found that reaction temperatures above 100° C lead to higher molecular weight copolymers which do not exhibit the properties of the desired copolymer and particularly since higher temperatures are more likely to cause opening of oxirane (epoxide) rings and thereby cause undesirable polymerization via the epoxy rings instead of via the double bonds. Examples of suitable reaction solvents include methyl ethyl ketone, acetone, dimethyl ether of diethylene glycol, monochlorobenzene, o-chlorotoluene, o-dichloro-toluene, acetonitrile, butyronitrile, etc. and mixtures thereof of which methyl ethyl ketone is preferred.

Copolymers are prepared by admixing the monomers in a solvent containing the polymerization catalyst after which the reaction mixture is heated to reflux and maintained at reflux temperature for a period of about 3 to 5 hours. Preferably, a small portion of the catalyst is added initially with the major proportion being added after reflux has started. The reaction mixture is subsequently allowed to cool to room temperature and the copolymer is precipitated from a suitable solvent such as methanol, ethanol, isopropanol or like compound which is a solvent for the catalyst and unreacted monomers but in which the copolymer is insoluble. The product is then dried at temperatures ranging from room temperature up to about 60° C. Substantially higher drying temperatures are to be avoided to eliminate undesirable crosslinking, increases in molecular weight or insolubilization (further polymerization) of the copolymer. The following example illustrates a typical preparation of copolymers of the invention:

EXAMPLE 1

Into a 3000 ml. resin flask equipped with a reflux condenser, thermometer, stirrer assembly and addition funnel are placed 360 g. of glycidyl methacrylate, 60 g. allyl glycidyl ether, 750 ml. of methyl ethyl ketone, and 0.982g. of benzoyl peroxide. The reaction solution is stirred vigorously while heating to reflux. Upon commencement of refluxing, a solution containing 2.97g. of benzoyl peroxide in 300 ml. of methyl ethyl ketone is added slowly from the addition funnel over a period of about 1½ hours. The temperature at reflux is about 88° C and is thus maintained, with stirring, over a total refluxing time of 5 hours after which the reaction mixture is permitted to cool to room temperature. Following cooling, 200 ml. of additional methyl ethyl ketone is added with stirring after which the solution is filtered and added slowly, preferably drop-wise, to 8 liters of methanol. The thus precipitated white product is collected and washed thoroughly with methanol after which it is suction dried at room temperature. There is obtained 195g. of a copolymer having an inherent viscosity of about 0.29 (indicative of a molecular weight of about 5030) when determined in butyronitrile at 25° C and an epoxy equivalent of 0.65 equiv./100g. of polymer.

II. Copolymer-Catalyst Compositions and Polymerization thereof

In accordance with the present invention, glycidyl methacrylate-allyl glycidyl ether copolymers are admixed with a Lewis acid catalyst precursor. The resulting mixture, at a convenient time subsequently, is subjected to the application of energy, such as actinic or electron beam irradiation, to release the Lewis Acid catalyst in sufficient amounts to initiate the desired polymerization reaction.

The materials utilized as latent polymerization initiators in the process and compositions of the present invention are radiation-sensitive catalyst precursors which decompose to effect polymerization upon application of energy. The energy required for effective decomposition may be thermal energy, applied by heating, or may be energy applied by bombardment with charged particles, notably by electron beam irradiation. Preferably, however, the catalyst precursors are photosensitive and the required energy is imparted by actinic irradiation which is most effective at those regions of the electromagnetic spectrum at which there is high absorption of electromagnetic energy by the particular catalyst precursor used. More than one of these types of energy may be applied to the system, e.g. ultraviolet light irradiation followed by electron beam irradiation. It is a unique feature of the copolymers of the invention that irradiation alone without subsequent heating is sufficient to effect a rapid and satisfactory cure.

The radiation-sensitive Lewis acid catalyst precursors are aromatic diazonium salts of complex halogenides which decompose upon application of energy to release a halide Lewis Acid. The aromatic diazonium cation may be represented generally as (Ar—N=N)$^+$, where the aryl group AR, which may be an alkaryl hydrocarbon group, is bonded to the diazonium group by replacing one of the hydrogen atoms on a carbon atom of the aromatic nucleus, and where the aryl group ordinarily carries at least one pendant substituent for greater stability of the cation. Thus the pendant substituent may be alkyl, or another substituent, or both. The complex halogenide anion may be represented by $(MX_{n+m})^{-m}$. Thus, the photosensitive salt and its decomposition upon actinic irradiation may be depicted as follows:

$$[Ar-N\equiv N]_m^+ [MX_{n+m}]^{-m} \xrightarrow{h\nu} mAr-X + mN_2 + MX_n \quad (1)$$

where X is the halogen ligand of the complex halogenide, M is the metallic or metalloid central atom thereof, $m$ is the net charge on the complex halogenide ion, and $n$ is the oxidation state of M and the number of halogen atoms in the halide Lewis acid compound released. The Lewis acid halide $MX_n$ is an electron pair acceptor such as $FeCl_3$, $SnCl_4$, $PF_5$, $AsF_5$, $SbF_3$, $BiCl_3$, and $BF_3$ which upon suitable irradiation of the diazonium complex salt is released in substantial quantities and initiates or catalyzes the polymerization process, wherein the copolymeric material is polymerized or cured as the result of the actinic irradiation.

The diazonium compounds of the present invention may be prepared using procedures known in the art, and such preparation forms no part of the present invention. Thus, for example, chlorometallic halogenide complexes may be prepared in accordance with the method set forth by Lee et al in *Journal of the American Chemical Society*, 83, 1928 (1961).

Exemplifying a procedure of general utility, arenediazonium hexafluorophosphates can be prepared by diazotizing the corresponding aniline with $NOPF_6$, made by combining HCl and $NaNO_2$ with subsequent addition of hydrogen hexafluorophosphate ($HPF_6$) or of a hexafluorophosphate salt, or they can be prepared by addition of a hexafluorophosphate salt to another diazonium salt to effect precipitation. As a further example, various morpholinoaryl complexes, containing the group

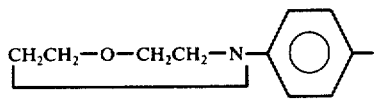

can be prepared either from the aniline derivative or by adding an aqueous solution of a metal salt of the desired complex halogenide to a solution of morpholinobenzenediazonium tetrafluoroborate.

Illustrative of the aromatic diazonium cations comprised in the photosensitive catalyst salts utilized in accordance with the present invention are the following:

p-chlorobenzenediazonium
2,4-dichlorobenzenediazonium
2,5-dichlorobenzenediazonium
2,4,6-trichlorobenzenediazonium
2,4,6-tribromobenzenediazonium
o-nitrobenzenediazonium
p-nitrobenzenediazonium
4-nitro-o-toluenediazonium(2-methyl-4-nitrobenzenediazonium)
2-nitro-p-toluenediazonium(4-methyl-2-nitrobenzenediazonium)
6-nitro-2,4-xylenediazonium(2,4-dimethyl-6-nitrobenzenediazonium)
2-chloro-4-(dimethylamino)-5-methoxybenzenediazonium
4-chloro-2,5-dimethoxybenzenediazonium
2,4′,5-triethoxy-4-biphenyldiazonium(2,5-diethoxy-4-(p-ethoxyphenyl)benzenediazonium)
2,5-dimethoxy-4′-methyl-4-biphnyldiazonium(2,5-dimethoxy-4-(p-tolyl)benzenediazonium)
2,5-diethoxy-4-(phenylthio)benzenediazonium
2,5-diethoxy-4-(p-tolylthio)benzenediazonium
p-morpholinobenzenediazonium
2,5-dichloro-4-morpholinobenzenediazonium
2,5-dimethoxy-4-morpholinobenzenediazonium
4-(dimethylamino)-1-naphthalenediazonium Illustrative of the complex halogenide anions comprised in the photosensitive catalyst salts utilized in accordance with the present invention are the following:

tetrachloroferrate(III), $FeCl_4^-$
hexachlorostannate(IV), $SnCl_6^{2-}$
tetrafluoroborate, $BF_4^-$
hexafluorophosphate, $PF_6^-$
hexafluorosenate(V), $AsF_6^-$
hexafluoroantimonate(V), $SbF_6^-$
hexachloroantimonate(V), $SbCl_6^-$
pentachlorobismuthate(III), $BiCl_5^{2-}$ A selection of aromatic diazonium salts of complex halogenides is listed in Table I. Many of the salts listed have been found to be well adapted or superior for use as latent photosensitive polymerization initiators in the process and compositions of the present invention, based on thermal stability, on solubility and stability in the epoxy formulations and solvents used, on photosensitivity, and on ability to effect polymerization with the desired degree of curing after adequate actinic irradiation. Following the name of each aromatic diazonium halogenide is its melting point or decomposition temperature in degrees centigrade, and wavelengths of electromagnetic radiation, in nanometers, at which it exhibits absorption maxima.

TABLE I

| | M.P., ° C. | Abs'n Max., nm. |
|---|---|---|
| 2,4-dichlorobenzenediazonium tetrachloroferrate(III) | 62-64 | 259, 285, 360 |
| p-nitrobenzenediazonium tetrachloroferrate(III) | 93-95 | 243, 257, 310, 360 |
| p-morpholinobenzenediazonium tetrachloroferrate(III) | 121.5 | 240, 267, 313, 364 |
| 2,4-dichlorobenzenediazonium hexachlorostannate(IV) | 190 | 285 |
| p-nitrobenzenediazonium hexachlorostannate(IV) | 126 | 258, 310 |
| 2,4-dichlorobenzenediazonium tetrafluoroborate | 152 | 285, 325–340 (shoulder) |
| p-chlorobenzenediazonium hexafluorophosphate | 162-164 | 273 |
| 2,5-dichlorobenzenediazonium hexafluorophosphate | dec. 140 | 264, 318 |
| 2,4,6-trichlorobenzenediazonium hexafluorophosphate | 240-250 | 294, 337 |
| 2,4,6-tribromobenzenediazonium hexafluorophosphate | 245-260 | 306 |
| p-nitrobenzenediazonium hexafluorophosphate | 156 (178) | 258, 310 |
| O-nitrobenzenediazonium hexafluorophosphate | 161.5 | |
| 4-nitro-o-toluenediazonium hexaflurophosphate | 123 (138) | 262, 319 |
| p-N-morpholinobenzene diazonium fluoroborate | 155 (163) | 257, 375 |
| p-Nitrobenzene diazonium fluoroborate | 140 (148-50) | 258, 311 |
| 2,5-diethoxy-4-(p-tolylthio)-benzene diazonium fluoroborate | 150 (157) | 354, 403 |
| 2-nitro-p-toluenediazonium hexa- | 164-165 | 286 |
| 6-nitro-2,4-xylenediazonium hexafluorophosphate | 150 | 237, 290 |
| p-morpholinobenzenediazonium hexafluorophosphate | 162 (181)[1.] | 377 |
| 4-chloro-2,5-dimethoxybenzenediazonium hexafluorophosphate | 168-169 (198-208) | 243 (shoulder) 287, 392 |
| 2,5-dimethoxy-4-morpholinobenzenediazonium hexafluorophosphate | Above 135 | 266, 396 |
| 2-chloro-4-(dimethylamino)-5-methoxybenzenediazonium hexafluorophosphate | 111 | 273, 405 |
| 2,5-dimethoxy-4-(p-tolythio)benzenediszonium hexafluorophosphate | 146 (155) | 358, 400 |
| 2,5-diethoxy-4-(p-tolylrthio)benzenediazonium hexafluorophosphate | 147 (150) | 223 (shoulder), 247, 357, 397 |
| 2,5-dimethoxy-4'-methyl-4-biphenyldiazonium hexafluorophosphate | 167 | 405 |
| 2,4',5-triethoxy-4-biphenyldiazonium hexafluorophosphate | 136 | 265, 415 |
| 4-(dimethylamino)-1-naphthalenediazonium hexafluorophosphate | 148 | 280, 310, 410 |
| p-nitrobenzenediazonium hexafluoroarsenate(V) | 141-144 (161) | 257, 310 |
| p-morpholinobenzenediazonium hexafluoroarsenate(V) | 162 (176-177) | 257, 378 |
| 2,5-dichlorobenzenediazonium hexafluoroantimonate(V) | 161.162.5 | 238, 358 |
| p-nitrovbenzenediazonium hexafluoroantimonate(V) | 140-141 | 257, 308 |
| p-morpholinobenzenediazonium hexafluoroantimonate(V) | 153(177.5 -180.5) | 254, 374 |
| 2,4-dichlorobenzenediazonium hexachloroantimonate(V) | 178-180 | 279, 322 (shoulder) |
| 2,4-dichlorobenzenediazonium pentachlorobismuthate(III) | 193.5-195 | 285, 313 |
| o-nitrobenzenediazonium pentachlorobismuthate(III) | 166.5-168 | 285, 313 |

Note 1. The melting points given in Table I were determined generally by the usual visual capillary tube method; in most cases discoloration began below the observed melting point temperature with frothing decomposition at that temperature. In some cases melting points or exotherms were determined also by differential thermal analysis under nitrogen gas, and the temperatures so determined are given in parentheses. The wavelengths of absorption maxima in the ultraviolet-to-visible range were determined with the diazonium complex salt dissolved in acetonitrile.

Referring to equation I hereinabove showing the photolytic decomposition of the catalyst precursor, the halide Lewis acid $MX_n$ released reacts with the epoxide material with a result exemplified by the following:

$(ArN_2)_m(MX_{n+m})$ + copolymer 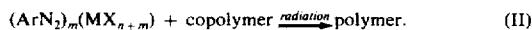 polymer.  (II)

The cationic catalyst is believed to act by cleaving a carbon-oxygen epoxy bond, initiating growth of a polymeric chain or permitting formation of a cross-linkage. A general application of the process embodied by equations I and II can be as follows: a diazonium complex salt, for example, as identified hereinabove, is admixed, with the use of a suitable solvent, with the epoxy copolymer. The mixture is thereafter coated on a suitable substrate such as a metal plate, plastic, or paper, and the substrate is exposed to ultraviolet or electron beam radiation. On exposure the diazonium compound decomposes to yield the Lewis Acid catalyst, which initiates the polymerization of the epoxy copolymer. The resulting polymer is resistant to most solvents and chemicals.

The source of radiation for carrying out the method of the present invention can be any suitable source, such as the actinic radiation produced from a mercury, xenon, or carbon arc, a beam from a laser source, for example a He-Cd laser, or the electron beam produced in or from a cathode ray gun. The only limitation placed on the radiation source used is that it must have an energy level at the irradiated film sufficient to impart to the polymerizable system energy at an intensity high enough to reach the decomposition level of the photosensitive compounds. As previously noted, the wavelength (frequency) range of actinic radiation is chosen to obtain sufficient absorption of energy to excite the desired decomposition.

For an imaging system, the mixture, which may contain a suitble solvent in substantial proportions, is coated on a metal plate, dried if necessary to remove solvent present, and the plate is exposed to ultraviolet light through a mask or negative. The light initiates polymerization which propagates rapidly in the exposed image areas. The resulting polymer in the exposed areas is resistant to many or most solvents and chemicals, while the unexposed areas can be washed with suitable solvents to leave a reversal image of an epoxy polymer in this embodiment.

Exemplary of such solvents suitable for development of the image are butyronitrile, butyronitrile-toluene mixtures, (preferably 1:1 mixtures), trichloroethylene-acetone, methyl ethyl ketone, cyclohexanone, tetrachloroethane-acetone, acetoneisopropanol, butyronitrile-o-chlorotoluene wherein the mixtures are preferably in 1:1 or 2:3 relative proportions.

The procedures for mixing the radiation-sensitive compositions of the present invention using the copolymeric epoxide are relatively simple. The epoxide is combined with the catalyst precursor in a suitable inert volatile solvent. By such a suitable solvent is meant any solvent compound or mixture which boils below about 190° C and which does not react appreciably with the epoxide or the catalyst precursor. Examples of such solvents include acetone, methyl ethyl ketone, dimethyl ether of diethylene glycol (bis(2-methoxyethyl ether), monochlorobenzene, o-chlorotoluene, o-dichlorotoluene, acetonitrile, butyronitrile, cyclohexanone, tetrahydrofuran or mixtures thereof and also mixtures of these solvents with other compounds in which the copolymer is substantially insoluble such as toluene, ethyl ether, anisole, 1,1,2,2-tetrachloroethane and trichloroethylene.

The amount of catalyst precursor employed should be sufficient to insure complete polymerization. It has been found that quite satisfactory results are obtained by providing a diazonium complex salt in amount by weight from about 0.5% to about 5% of the catalyst precursor relative to the weight of the polymerizable material provided, about 1% or less of the precursor being amply effective.

It may be desirable to include in the composition an inert pigment or filler, which may be present in even a major proportion by weight. Inclusion of such inert ingredients usually makes advisable a proportionate increase in the optimum amount of catalyst precursor added. Nevertheless, the amount of the precursor needed rarely exceeds 5% of the entire weight of the composition.

The following examples will serve to further illustrate the present invention.

EXAMPLE 2 a. The following formulation was prepared:

5 g. of glycidyl methacrylate-allyl glycidyl ether copolymer of Example 1
5.0 g. of o-chlorotoluene
44.4 ml. of butyronitrile
0.25 g. of 2,5-diethoxy-4-(p-tolylthio) benzene diazonium hexafluorophosphate The filtered solution was whirl-coated onto dichromated aluminum at a rate of 60 RPM. Sample strips cut from the plate were exposed to a xenon lamp through a Kodak No. 2 step tablet for the times indicated below.

b. For purposes of comparison, a formulation similar to formulation (a) but utilizing as the epoxide component ECN 1299, an epoxy cresol novolac having a molecular weight of 1270 and an epoxide equivalent of 0.425 per 100 g. of polymer (available commercially from CIBA Pharmaceutical Products) was prepared as above. The exposure and results are as indicated below:

1. Five exposure units (an exposure unit is approximately equal to one second exposure)

After immediate development of the above sample strips of formulation (a) in acetone-methyl ethyl ketone solution, six steps were reproduced. The coating of formulation (b) washed off. It required 55 units of exposure to reproduce 6 steps with formulation (b).

To demonstrate superior adhesion properties of the above formulation (a), the coating of a sample strip was scratched and submerged in water for 20 minutes. A sample strip prepared from formulation (b) was identically treated.

After drying, a strip of Scotch brand mylar pressure-sensitive tape was pressed over the coated and scratched portions of the plates and pulled off. None of the coating derived from formulation (a) was lifted off. The coating derived from formulation (b) did not adhere at all and was readily removed by lifting the tape.

2. Eight exposure units

An eight second exposure was made on samples of plates derived from formulations (a) and (b) respectively. The individual plates were immediately sliced longitudinally to give two equally exposed strips of plate.

Results with formulation (a):

Immediate development of one of these strips gave 7 steps.

Development of the second after 30 minutes gave 9 steps indicating a growth of 2 steps due to continuing reaction.

Results with formulation (b):

Immediate development of one of the strips of this formulation resulted in washing away of the entire coating. It was determined that greater exposure times were necessary with this formulation to obtain a meaningful number of steps. (In general, reproduction of at least 6 steps is required to demonstrate usefulness for preparation of litho plates, for example). The necessary exposure for this formulation was determined to be 80 exposure units to obtain 7 steps and the step growth observed with this formulation was 5 steps due to continuing reaction.

This example illustrates the superiority of the copolymers of the invention over one of the most efficient commercial epoxide materials, ECN 1299, when employed as a photoresist in exhibiting greater adhesive strength to aluminum, in requiring less exposure (a measure of its superior photosensitivity) and in exhibiting a reduction in step growth after exposure, (a measure of the rapidity and completeness of its cure). When either of commercially available epoxides such as EPON 1009, a bis-phenol A-glycidyl ether polymer or Araldite 6054 are substituted for ECN 1299 of formulation (b), the results are even less comparable to those received with formulation (a) since these resins have been found to be less photosensitive than the ECN 1299 resin compared above.

Offset printing plates made with formulation (a) showed no signs of adhesion failure at least up to 88,000 impressions, an indication of the durability of the coatings produced.

EXAMPLE 3

The following formulations were prepared:

a. 9.0 g. glycidyl methacrylate-allyl glycidyl ether copolymer having an inherent viscosity of 0.29 and an epoxide equivalent of 0.65, 13 g. o-chlorotoluene, 78 g. butyronitrile 0.450 g. 2,5-diethoxy-4-p-tolylthio benzene diazonium hexafluorophosphate b. 9.0 g. polyglycidyl methacrylate having an inherent viscosity of 0.13 and epoxide equivalent of 0.65 0.450 g. 2,5-diethoxy-4-p-tolylthio benzene diazonium hexafluorophosphate, 13 g. o-chlorotoluene, 78 g. butyronitrile, In each case the solutions were treated with Cellite 503 filter aid, filtered through paper and then through a 7u millipore filter.

Solutions of the above formulations (a) and (b) were coated onto a polyethylene terephthalate photographic film base (available commercially under the trademark Cronar). After drying, the coatings were exposed to an ultraviolet light source through a Kodak No. 2 step tablet for 10 seconds and developed employing a mixture of trichloroethylene and acetone. The results were that 12 steps were reproduced with the coating of formulation (a), while 7 steps were reproduced with the coating of formulation (b). The results indicate that the glycidyl methacrylate-allyl glycidyl ether of this invention is 5 times as photosensitive as the polyglycidyl methacrylate of the prior art even when selected to have the same epoxide equivalent.

EXAMPLE 4

To illustrate the criticality of the various parameters relative to epoxide equivalent and inherent viscosity in the present invention, copolymers were prepared employing the procedure of Example 1 with deviations therefrom as indicated in the Table which follows. All of the preparations utilized methyl ethyl ketone as reaction solvent and benzoyl peroxide as catalyst. With the exception of the first preparation, all components were placed in the reaction vessels at one time and then heated to reflux. In preparation 1, the procedure of Example 1 was followed wherein the major portion of catalyst was added dissolved in methyl ethyl ketone after refluxing had begun. In preparation 10, a trace amount (200 ppm) of p-methoxy phenol was added to control the molecular weight (inherent viscosity). The inherent viscosity was obtained in butyronitrile at 25° C.

Copolymers with the epoxide equivalents and inherent viscosities indicated were formulated as in Example 2 containing the same amounts of solvents and photosensitive initiator indicated therein. The formulations were applied to a substrate and the relative sensitivity was obtained from the number of steps of a Kodak No. 2 step tablet remaining on the substrate after 10 seconds of exposure to a xenon lamp and solvent development for 2 minutes employing a 3:1 mixture of trichloroethylene-acetone as the developing solvent, followed by a final rinse in toluene.

equivalent are more useful since they have higher resistance to abrasion and strong etchants.

The polymers produced by polymerizing the copolymers of the present invention are useful in a wide variety of applications in the field of graphic arts due to their superior adhesion to metal substrates, excellent resistance to most solvents and chemicals and capability of forming high resolutions images. Among such uses are photoresists for chemical milling, gravure images, offset plates, letterpress plates, stencil-making (as disclosed and claimed in application Ser. No. 283,629, filed Aug. 25, 1972 entitled "Epoxy Photopolymer Duplicating Stencil" now U.S. Pat. No. 3,826,650 issued July 30, 1974), micro-images for printed circuitry, micro-images for informatiom storage, thermoset vesicular images, decoration of paper, glass and packages and light-cured coatings, photofabrication and photoetching. The copolymers of the invention have been discovered to be particularly effective for use in recording and storing

TABLE II

| Preparation No. | Mole Ratio GMA/AGE | Mole % Peroxide Catalyst | Epoxide Equiv. Per 100 g. | Inherent Viscosity | No. Steps after 10 Second Exposure | Relative Sensitivity |
| --- | --- | --- | --- | --- | --- | --- |
| 1 | 4.82 | 0.53 | 0.65 | 0.29 | 12 | 1.00 |
| 2 | 4.82 | 0.53 | 0.66 | 0.50 | 10 | 0.83 |
| 3 | 4.82 | 0.53 | 0.69 | 0.27 | 10 | 0.83 |
| 4 | 4.82 | 0.53 | 0.65 | 0.38 | 12 | 1.00 |
| 5 (Comparative) | 4.82 | 0.15 | 0.45 | 0.59 | Did not develop cleanly; Exposed Film poor and hazy; Unexposed film incompletely developed; unexposed areas tend to cure in the dark. | — |
| 6 (Comparative) | 1.20 | 0.41 | 0.74 | 0.22 | 6 | 0.50 |
| 7 (Comparative) | 4.82 | 0.53 | 0.64 | 0.17 | 4–5 | 0.33–0.41 |
| 8 (Comparative) | 1.00 | 0.53 | 0.62 | 0.12 | 1 | .083 |
| 9 (Comparative) | 4.82 | 0.28 | 0.66 | 0.10 | 3 | .25 |
| 10 (Comparative) | 4.82 | 0.53 | 0.65 | 0.10 | 3 | .25 |

It can thus be seen that the combined parameters relative to the epoxy equivalent and inherent viscosity of the copolymers of the invention are of critical importance to the successful practice of the invention, the superior photosensitivity of those copolymers having properties within these parameters being readily observed.

The present invention provides copolymers of varying viscosity and solubility in coating and processing solvents which permits tailoring of the particular copolymer for the particular application. For example, copolymers within the preferred range of inherent viscosity having an epoxide equivalent of at least about 0.65 will exhibit better solubility than higher viscosity copolymers, are readily filtered through Millipore filters of a micron or less in size and are particularly useful for applications demanding high resolution images. As the inherent viscosity exceeds the 0.38 level, the solutions are not as readily soluble, are more difficult to filter through standard filters of submicron size and are not as useful in high image resolution applications. On the other hand, where high resistance to abrasion or etchants or solvent action becomes the more important consideration as where the material is used on a chrome photomask or is itself used as a photomask, the higher viscosity copolymers exhibiting the proscribed epoxy information derived form a laser source.

The following examples illustrate use of the copolymers for various of these applications.

EXAMPLES 5

A formulation was prepared consisting of 50 g. of a 15% solution of the copolymer of Example 1 in butyronitrile and 0.37 g. of 2,5-diethoxy-4(p-tolythio) benzene diazonium hexafluorophosphate. After filtering the solution, spin-coatings were made on polyethylene terephthalate film available commercially as Cronar or Mylar film at a speed of 200 rpm. A contact print was made on the coated Cronar from a 24 X microfiche negative in a vacuum frame. The exposure time was 3 seconds using an Aristo model B3642 ultraviolet grid lamp. Development in a solution of butyronitrile or a 1:1 mixture of butyronitrile and toluene followed by a rinse in toluene, yielded an excellent colorless positive image with no frosting. Development of another sample in a 3:1 mixture of trichloroethylene and acetone resulted in an image with slight frosting.

If desired, the image can be dyed employing a dye solution such as CIBA's Orasol Black Dye in trichloroethylene followed by a rinse in trichloroethylene.

The compositions described in Part II hereinabove may be employed for recording and storing information from a laser source as illustrated hereinbelow. When utilized as holograms, they are particularly valuable, since the copolymer forms a clear film in the absence of catalyst. This is important since it is desired to avoid absorption of light going through in the reconstruction of the hologram. Utilizing the compositions of this invention, once they are polymerized adequately and developed, the copolymer is a clear film. Holograms derived from the compositions of the invention are characterized by having high image resolution capacity, images prepared are stable and unaffected by humidity, temperature and surface abrasion; they are easily, rapidly and economically prepared and once prepared are long-lived.

Holograms and other articles for recording information from a laser source according to the present invention may be prepared employing means conventional in the art. An example of such apparatus may be as described and illustrated in U.S. Pat. No. 3,410,203 issued November 12, 1968. Thus, suitable apparatus includes means for supplying a coherent beam of radiation derived from a laser source to a substrate coated with the compositions of Part II hereinabove. To prepare a holographic image on said coated substrate, data may be photographed on a transparency, for example as derived from an electronic photocomposition system such as RCA Videocomp 70/820. The transparency is positioned so that an information beam of light from a laser source is projected thereon. The information beam may first be scattered through a diffuser, and a reflective mirror positioned intermediate the diffuser and the laser, that splits the light beam from the laser into a reference beam and an information beam, may be employed. The reference beam is directed onto a mirror to provide a reference path from the laser source to a photosensitive film comprising the compositions of the present invention. The mirror is positioned so that the reference beam forms an angle with the horizontal. The information beam travels through the transparency directly to the photosensitive composition or hologram. The combination of the reference beam and the information beam travelling by different paths to the hologram produces interference patterns on the hologram to cause the print data in the transparency to be recorded as a holographic image on the hologram. The photosensitive compositions of this invention are hardened onto the surface and in the volume of the hologram at those places where light from the reference beam and information beam interfere constructively and the hologram is developed employing the developing solvents disclosed hereinabove.

Any suitable support to which the cured polymer will adhere may form the surface of the hologram including metal, glass, plastic, silicon wafers, paper, rubber, etc.

Coatings may be applied to said supports at various rates or thicknesses. In general, thicknesses of 0.1 $\mu$m to 2 $\mu$m have been satisfactorily employed in our work. Additionally, information received by laser scanning may be recorded on plastic tape and other substrates such as metal, paper, rubber, glass, silicon wafers, etc.

It is to be understood that the particular laser apparatus and combination thereof forms no part of the present invention and any of conventional systems may be employed. Thus, a single laser may be employed, as, for example, a gas laser such as a carbon dioxide laser or any of well known lasers. Alternatively, a laser, for example, a 4416A helium-cadmium laser may be employed with a separate second laser beam to provide the interference pattern. It is preferred that the wavelength employed be within the range of maximum sensitivity of the catalyst, for example, from 3500–4500A for the preferred 2,5-diethoxy-4-(p-tolylthio) benzene diazonium hexafluorophosphate. The specific wavelength ranges for maximum sensitivity will of course depend on the particular catalyst and may be readily ascertained from the absorption maxima listed in Table I.

The developed hologram may be subsequently subjected to further treatment for adaptation to various applications. For example, it may be employed in video tape systems such as the RCA Selectavision wherein it may be electrolytically plated with nickel which may then be stripped away bearing an impression of the hologram. Such impression may then be employed to press out further images on plastic tape such as vinyl or polyethylene.

Alternatively and uniquely, impression images may be made by a novel procedure which eliminates the need for a nickel master employing the hologram or photoresist image directly to replicate impressed images on various thermoplastic materials. In this procedure, the hologram or photoresist is prepared and developed as described above. The hologram or photoresist image is heated to a temperature of about 120° to 130° C, and is contacted with a thermoplastic material while pressure such as that exerted by contact rollers or even hand is applied thereto, leaving replicated impressions of the hologram or photoresist image on the thermoplastic material.

Suitable thermoplastic materials to receive impressions from the hologram or photoresist may be materials having a softening point below the softening point of the substrate bearing the photoresist image and that of the photoresist itself. In general, such materials having softening points below 150° C, preferably below 135° to 140° C, may be utilized. Exemplary of such materials are polyethylene terephthalate, polyethylene, polypropylene, polyacrylics, polyvinylchloride, polystyrene, polyvinylidine chloride, poly(chlorotrifluoroethylene), polytetrafluoroethylene (Teflon), Nylon 6, Nylon 6,6,polycarbonate (Lexan, a polyester derived from bis-phenol A and carbonic acid), cellulose acetate, cellulose acetate butyrate, cellulose propionate, ethyl cellulose, and polyacetal resins. Such materials may be employed in any convenient form or shape, for example, as sheet, tape, rolls, ribbons, etc.

The following examples are given to illustrate further embodiments of the invention:

EXAMPLE 6

A microfiche contact print was made as in Example 5 and heated at 130° C for 1 hour to effect maximum hardening and curing of the image on the coated film. The print was then run through a pair of metal rollers with the copied information in contact with a strip of polyvinyl chloride of about 2-3 mils thickness. The roller in contact with the backside of the plastic film bearing the photoresist image to be replicated was heated to 125° C. After passing between the rollers, the polyvinyl chloride film had an intaglio copy of the information on the photopolymer film copy pressed into it. Information thus replicated could be read on a microfiche reader and several copies were made from the one master photopolymer film.

EXAMPLE 7

A master solution was made of the following ingredients:

20 g. allyl glycidyl ether - glycidylmethacrylate copolymer of Example 1

20 g. o-chlorotoluene 176 ml. butyronitrile

After all solid material had gone into solution, the solution was filtered and percent solids was determined to be about 10.95%. From this master solution, a coating solution containing 85.3 g. master solution and 0.467 g. 2,5-diethoxy-4-(p-tolylthio)benzene diazonium hexafluorophosphate was prepared and filtered through a double layer of paper towels. The solution was whirl coated onto large glass slides at 60 rpm to a thickness of 0.06 mil. at a low heat setting on the whirl coater for 15 minutes. The coated slides were used after 24 hours as follows to prepare a hologram:

Three coated slides were exposed to a 4400 A He-Cd laser employing a second laser to provide the interference pattern. Each slide was then developed in a 1:1 methylethylketone-trichloroethylene solution.

The first slide was positioned with information and reference beams at a 23° angle and exposures of 1, ½, 1/5, 1/10 and 1, 2, 5, 10 seconds duration in two rows. After development, the interference patterns could be seen as with the first slide but were not as sharply defined.

The extent of resolution was determined, employing the Bragg equation, to be at least 1000 line pair/$^{mm}$.

EXAMPLE 8

A solution was made consisting of 0.576 g. of 2,5-diethoxy-4-(p-tolylthio)benzene diazonium hexafluorophosphate in 122.6 g. of a 9.42% solution of the copolymer of Example 1 in butyronitrile. After filtering the solution, it was used to spin coat glass slides at 800 rpm. A coated slide was exposed for 5 seconds at the point of reconvergence of the split beam of a Coherent Radiation Model 53A Argon ion laser. The beam separation angle at this point was 20° and the power of the laser beam was about 100 mw at 363.8 mm. The exposed spot was developed in a solvent composed of 3 volumes trichloroethylene and 1 volume of acetone. A bright diffraction grating resulted which could be discerned under the microscope as a series of sharp, parallel lines. The resolution was calculated to be 954 cycles/mm.

Similar examples were run with additional glass slides or Cronar films as substrates employing an optimum copolymer coating thickness of 0.8 to 1.2mm. Diffraction efficiencies up to 25% were measured on such slides. In one run, employing a beam separation angle of 87°, thicknesss of 0.7μm and glass as the substrate, a resolution capability up to at least 3700 cycles/mm was obtained.

The following example was run to determine the energy requirement for image-wise crosslinking employing a laser beam as the enrgy source.

EXAMPLE 9

The formulation of Example 8 was employed to make coatings on Mylar film at 60 RPM whirler speed. A series of exposure spots were made on the coating using the laser of Example 8 emitting 250 mw at 351.1 andd 363.8 mm combined. Using a combination of increasing shutter speeds and filters of known absorption at these wave lengths, a series of 1.5mm$^2$ area exposure spots of diminishing duration and intensity was made across the surface of the coated film down to 100 u-secs. equivalent exposure time. The exposed spots were developed in a 3:2 mixture of trichloroethylene and acetone and when held to a light source, the developed spot could be seen. The ability to develop a visible photoresist spot with 100 u-secs. equivalent exposure at 250 mw indicated a calculated energy requirement of 1.27 millijoules/cm$^2$. From this data, a laser scanning speed of 20,000 inches per second for a 1 mil wide line was indicated.

We claim:

1. A method of polymerizing a copolymer of glycidyl methacrylate and allyl glycidyl ether, said copolymer being derived from reaction of a mixture consisting essentially of the monomers containing from about a 4 to 5 molar excess of glycidyl methacrylate per mole of allyl glycidyl ether and having pendant epoxy groups, an inherent viscosity of at least about 0.25 and an epoxy equivalent of at least about 0.65 epoxide equivalent per 100 grams of polymer, which comprises:

admixing said copolymer with a photosensitive aromatic diazonium salt of a complex halogenide which decomposes upon exposure to irradiation to release a halide Lewis Acid effective to initiate polymerization of said copolymer selected from compounds having the general formula $(ArN_2)_m (MX_{n+m})^{-m}$ wherein Ar is an aryl or substituted aryl group, X is chlorine or fluorine, M is P, $n$ is the oxidation state of M, and m is the number of diazonium groups as determined by the net charge on the anion $(MX_{n+m})^{-m}$; and exposing said mixture to electromagnetic or electron beam irradiation to effect said polymerization.

2. A method is claimed in claim 1 wherein said irradiation is electromagnetic irradiation.

3. A method as claimed in claim 1 wherein said irradiation is electron beam irradiation.

4. A method of polymerizing a copolymer of glycidyl methacrylate and allyl glycidyl ether, said copolymer being derived from reaction of a mixture consisting essentially of from about 4 to about 5 moles of glycidyl methacrylate per mole of allyl glycidyl ether in the presence of a free-radical polymerization catalyst and a solvent at a temperature below about 100° C, and having pendant epoxy groups, an inherent viscosity of at least about 0.25, and an epoxide equivalent of at least about 0.65 epoxide equivalent per 100 grams of polymer, which comprises:

admixing said copolymer with a photosensitive aromatic diazonium salt of a complex halogenide which decomposes upon exposure to irradiation to release a halide Lewis Acid effective to initiate polymerization of said copolymer selected from compounds having the general formula $(ArN_2)_m (MX_{n+m})^{-m}$; wherein Ar is an aryl or substituted aryl group, X is chlorine or fluorine, M is P, n is the oxidation state of M, and M is the number of diazonium groups as determined by the net charge on the anion $(MX_{n+m})^{-m}$; and exposing said mixture to electromagnetic or electron beam irradiation to effect said polymerization.

5. A method as claimed in claim 1 wherein said copolymer has an inherent viscosity of about 0.25 to about 0.38 and an epoxide equivalent of about 0.65 to about 0.74.

6. A method as claimed in claim 5 wherein said irradiation is electron-beam radiation.

7. A method as claimed in claim 5 wherein said irradiation is electromagnetic radiation.

8. A method of polymerizing a copolymer of glycidyl methacrylate and allyl glycidyl ether, said copolymer being derived from reaction of from about 4 to about 5 moles of glycidyl methacrylate per mole of allyl glycidyl ether in the presence of a free-radical polymerization catalyst and a solvent at a temperature below about 100° C, and having pendant epoxy groups, an inherent viscosity of about 0.25 to 0.38, and an epoxide equivalent of about 0.65 to 0.74 epoxide equivalent per 100 grams of polymer, which comprises:

admixing said copolymer with a photosensitive aryl diazonium hexafluorophosphate which decomposes upon exposure to irradiation to release a halide Lewis Acid effective to initiate polymerization of said copolymer; and exposing said mixture to electromagnetic or electron beam irradiation to effect said polymerization, said copolymer being substantially polymerized after an exposure time of not more than about 10 seconds.

9. A method as claimed in claim 8 wherein said aryl diazonium hexafluorophosphate is 2,5-diethoxy-4-(p-tolylthio) benzene diazonium hexafluorophosphate.

* * * * *